(12) United States Patent
Hong et al.

(10) Patent No.: US 10,957,578 B2
(45) Date of Patent: Mar. 23, 2021

(54) SINGLE DIFFUSION BREAK DEVICE FOR FDSOI

(71) Applicant: GLOBALFOUNDRIES U.S. INC., Santa Clara, CA (US)

(72) Inventors: Wei Hong, Clifton Park, NY (US); Hui Zang, Guilderland, NY (US); Hsien-Ching Lo, Clifton Park, NY (US); Zhenyu Hu, Clifton Park, NY (US); Liu Jiang, Clifton Park, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/146,413

(22) Filed: Sep. 28, 2018

(65) Prior Publication Data

US 2020/0105584 A1    Apr. 2, 2020

(51) Int. Cl.
*H01L 21/762* (2006.01)
*H01L 27/12* (2006.01)
*H01L 29/78* (2006.01)
*H01L 21/02* (2006.01)
*H01L 21/311* (2006.01)

(52) U.S. Cl.
CPC .. *H01L 21/76281* (2013.01); *H01L 21/76283* (2013.01); *H01L 27/1203* (2013.01); *H01L 29/7846* (2013.01); *H01L 21/02164* (2013.01); *H01L 21/02236* (2013.01); *H01L 21/02255* (2013.01); *H01L 21/31116* (2013.01); *H01L 21/31144* (2013.01)

(58) Field of Classification Search
CPC .................................................. H01L 29/7846
See application file for complete search history.

(56) References Cited

U.S. PATENT DOCUMENTS

2015/0093861 A1* 4/2015 Loubet ............. H01L 21/84
                                                      438/154
2019/0027603 A1* 1/2019 Cheng ............. H01L 27/0924

OTHER PUBLICATIONS

Application and Drawings for related U.S. Appl. No. 15/652,585, filed Jul. 18, 2017, 46 pages.

* cited by examiner

*Primary Examiner* — Raj R Gupta
(74) *Attorney, Agent, or Firm* — David Cain; Andrew M. Calderon; Roberts Calderon Safran Cole, P.C.

(57) ABSTRACT

The present disclosure relates to semiconductor structures and, more particularly, to a single diffusion break device and methods of manufacture. The structure includes a single diffusion break structure with a fill material between sidewall spacers of the single diffusion break structure and a channel oxidation below the fill material.

20 Claims, 3 Drawing Sheets

US 10,957,578 B2

SINGLE DIFFUSION BREAK DEVICE FOR FDSOI

FIELD OF THE INVENTION

The present disclosure relates to semiconductor structures and, more particularly, to a single diffusion break device and methods of manufacture.

BACKGROUND

Significant progress has been made in the field of semiconductor devices, wherein, in particular, sophisticated CMOS (complementary metal oxide semiconductor) techniques may be considered as a main contributor to this development. In the CMOS technique, a large number of P-type and N-type transistor elements may be integrated into a single semiconductor chip and may be functionally connected so as to form highly complex functional units, such as complex control circuitry, microcontrollers, CPUs (central processing units) and the like.

The significant advances in terms of superior performance and increased integration density may be associated with the continuing reduction of critical dimensions of transistor elements, which may enable the integration of several hundred millions or more transistor elements in complex integrated circuits. The capability of reliably producing reduced critical dimensions in every new device generation has been mainly driven by significant improvements in lithography techniques and correlated patterning strategies, wherein even critical dimensions well beyond the optical resolution capabilities of modern lithography equipment may be obtained. For example, defining active regions for transistor elements requires sophisticated lithography and patterning strategies, wherein, typically, two independent patterning sequences are involved, thereby contributing to overall cost and complexity of the manufacturing process.

Current designs can use drain to drain connections with a filler (e.g., dummy gates) that costs at least one cell in standard cell design. For example, in some current designs it is necessary to use two dummy gates to provide the required isolation between active devices. The filler, also, generally increases overall leakage. Due to the overall leakage increase, it is only possible to provide a single voltage type to the drains because there is no physical isolation. In other designs, processes and structures have been shown to reduce stress after etching SOI, which will cause device degradation.

SUMMARY

In an aspect of the disclosure, the structure comprises: a single diffusion break structure comprising a fill material between sidewall spacers of the single diffusion break structure; and a channel oxidation of substrate material within a channel region below the fill material.

In an aspect of the disclosure, a structure comprises: a plurality of active gate structures each comprising a channel region composed of semiconductor material and diffusion regions adjacent to the channel region; and a diffusion break structure composed of an oxidation region of the semiconductor material physically isolating the diffusion regions of adjacent active gate structures of the plurality of active gate structures.

In an aspect of the disclosure, a method comprises: forming active gate structures and a dummy gate structure between the active gate structures, the active gate structures and the dummy gate structure being composed of fully depleted semiconductor on insulator material within their respective channel regions; exposing the fully depleted semiconductor on insulator material within the channel region of the dummy gate structure by patterning processes; oxidizing the exposed fully depleted semiconductor on insulator material within the channel region of the dummy gate structure to form a physical isolation structure between diffusions of the active gate structure; protecting the oxidized channel region of the dummy gate structure with material during processing steps performed at least on the active gate structures; and removing the material after the processing steps of the active gate structures.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a single diffusion break device and methods of manufacture. More specifically, the present disclosure relates to a single diffusion break device in fully depleted silicon on insulator technologies with a channel oxidation (compared to a direct cut process). Advantageously, the present disclosure provides techniques and semiconductor devices in which transistor elements may be formed on the basis of appropriately patterned active semiconductor regions, while avoiding, or at least reducing, the effects of one or more of the problems identified above. Particularly, by implementing the structures and processes described herein, it is possible to, amongst other things, improve scaling, reduce leakage for PFETs (and NFETs), increase contact overlap of shallow trench margin and prevent stress loss and device degradation.

In embodiments, the single diffusion break is provided by a channel oxidation process. In this process, a contact cut last process is used over a dummy gate (PC) line. The contact cut is a continuous etch, which is followed by an oxidation process of the channel region of dummy gate structure, in the continuous etch, to provide an isolation structure. The isolation structure is a physical structure which reduces overall leakage and design area, while allowing the application of different voltages on the drains. The oxidation process will also not exhibit any stress loss in the cut (e.g., SOI cut).

In more specific embodiments, the single diffusion break device comprises a nitride fill inside a single diffusion break structure, which is about the SOI material above a channel region of a dummy gate structure. An oxidization process is provided below the nitride fill in the channel of the dummy gate structure (e.g., breaking the SOI material between adjacent gate structures). The oxidation is provided in a single diffusion break etch, e.g., SOI/cSiGe channel oxidation.

The single diffusion break device of the present disclosure can be manufactured in a number of ways using a number of different tools. In general, though, the methodologies and tools are used to form structures with dimensions in the micrometer and nanometer scale. The methodologies, i.e., technologies, employed to manufacture the single diffusion break device of the present disclosure have been adopted from integrated circuit (IC) technology. For example, the structures are built on wafers and are realized in films of material patterned by photolithographic processes on the top of a wafer. In particular, the fabrication of the single diffusion break device uses three basic building blocks: (i) deposition of thin films of material on a substrate, (ii) applying a patterned mask on top of the films by photolithographic imaging, and (iii) etching the films selectively to the mask.

Figure 1:
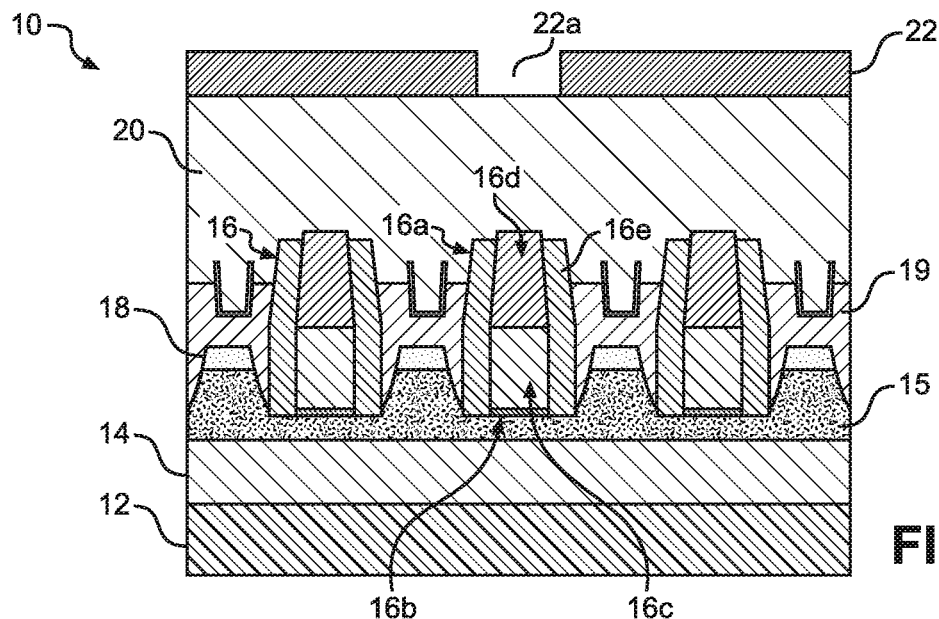
FIG. 1 shows gate structures in a fully depleted SOI technology, amongst other features, and respective fabrication processes in accordance with aspects of the present disclosure.

FIG. 1 shows gate structures in a fully depleted SOI technology, amongst other features, and respective fabrication processes in accordance with aspects of the present disclosure. In particular, the structure 10 is a planar structure which includes substrate 12. In embodiments, the substrate 12 can be a silicon substrate; although other substrate materials are contemplated herein. An oxide material 14 is bonded to the substrate 12. In embodiments, the oxide material 14 can be a $SiO_2$; although other insulator materials are also contemplated herein. The oxide material 14 can be a buried oxide (BOX). A semiconductor material 15 is formed on the oxide material 14 to form SOI technology based devices. In embodiments, the semiconductor material 15 can be, e.g., C—SiGe for a PFET device or fully depleted silicon (at least in the channel region) for an NFET device.

Still referring to FIG. 1, gate structures 16, 16a are formed on the semiconductor material 15. In embodiments, the gate structure 16a can be a dummy gate structure formed between active gate structures 16. The gate structures 16, 16a are formed by gate first processes using conventional deposition, lithography and etching processes such that no further explanation is required for a complete understanding of the present disclosure.

In embodiments, the gate structures 16, 16a include a gate dielectric material 16b, e.g., $HfO_2$ $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. A poly material 16c is formed over the gate dielectric 16b material, with a capping material 16d, e.g., nitride, over the poly material 16c. Sidewall spacers 16e are formed on sides of the gate structures 16, 16a using conventional deposition processes followed by an anisotropic etching process. The sidewall spacers 16e can be a nitride material or other low-k dielectric material. For example, the sidewall spacers 16e can be SiBCN.

FIG. 1 further shows diffusion regions, e.g., source and drain regions. In embodiments, the diffusion regions 18 are raised source and drain regions formed from a grown epitaxial material. In embodiments, the epitaxial material can be Si or SiGe material, as examples. The raised source and drain regions 18 can also include a silicon capping material. An insulator material 19 is deposited over the raised source and drain regions 18 and gate structures 16, 16a. In embodiments, the insulator material 19 can be an oxide material deposited by conventional deposition processes, e.g., chemical vapor deposition (CVD) processes.

A plurality of masking materials 20, 22 are deposited on the insulator material, followed by conventional lithography and etching processes to form an opening 22a in the material 22. In embodiments, the opening 22a is aligned with the dummy gate structure 16a and, more particularly, the poly material 16c between the sidewall spacers 16e. The materials 20, 22 can be, e.g., SOH and SION.

In embodiments, the opening 22a is formed by placing a resist over the material 22 and exposing it to energy (light) to form a pattern (opening). An etching process with a selective chemistry, e.g., reactive ion etching (RIE), is used to form the opening 22a in the material 22 through the openings of the resist. The resist can then be removed by a conventional oxygen ashing process or other known stripants.

Figure 2:
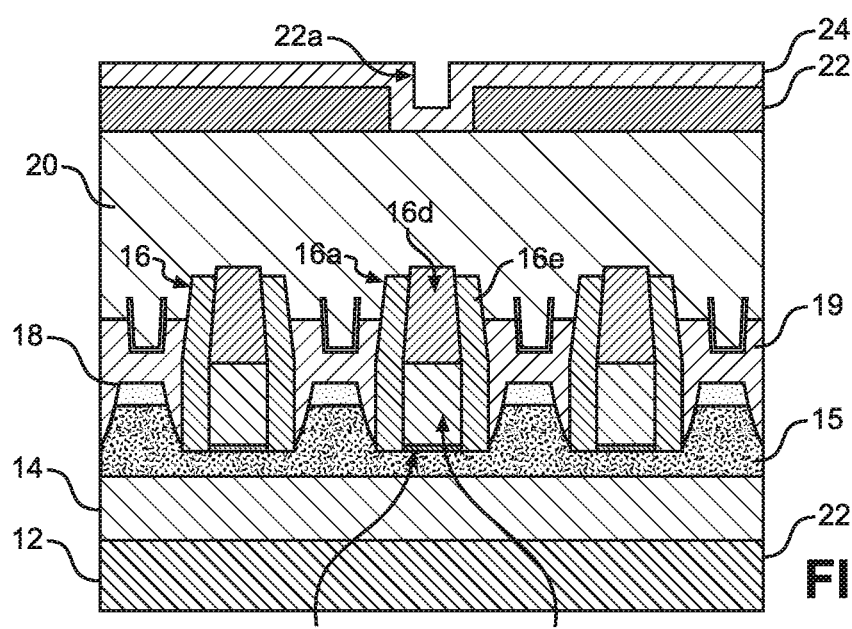
FIG. 2 shows masking material and insulator material over the gate structures, amongst other features, and respective fabrication processes in accordance with aspects of the present disclosure.

In FIG. 2, an insulator material 24 is deposited over the material 22 and within the opening 22a. In embodiments, the insulator material 24 is an oxide material that can be deposited by an atomic layer deposition (ALD) process. The insulator material 24 can be deposited to a thickness of about 5 nm to about 50 nm and preferably about 10 nm; although other dimensions are also contemplated herein. For example, the insulator material 24 can be deposited to any thickness that completely covers the hardmask material 22 in the opening 22a, without pinch off occurring, e.g, resulting in the space shrinking to about 20 nm.

Figure 3:
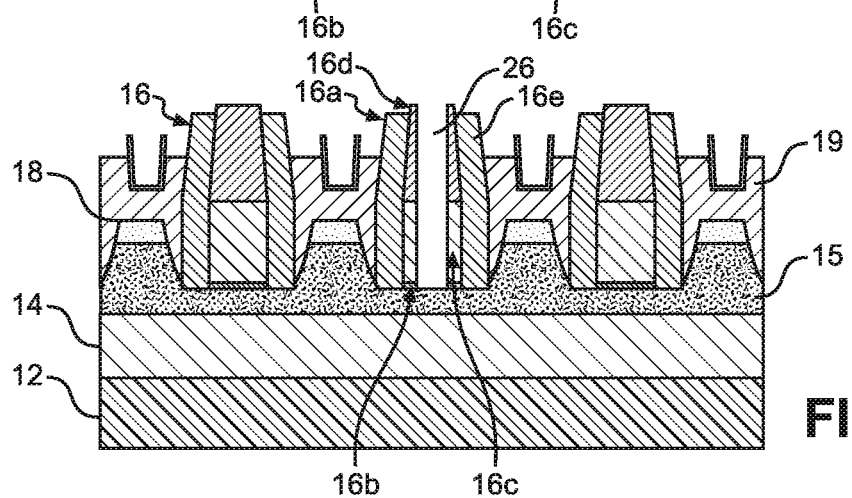
FIG. 3 shows an opening through the dummy gate structure, amongst other features, and respective fabrication processes in accordance with aspects of the present disclosure.

As shown in FIG. 3, an opening 26 is formed through the dummy gate structure 16a, e.g., between the sidewall spacers 16e, using a maskless etching process with the hardmask material 22. In more specific embodiments, the opening 26 extends through the capping material 16d, poly material 16c and gate dielectric material 16b of the dummy gate structure 16a, exposing the underlying substrate material 15. The sidewalls of the opening 26 will include the stacked layers of materials 16b, 16c, 16d, within the confines of the sidewall spacers 16e. In embodiments, the etching process can be a timed etching process with chemistries selective to the materials 16b, 16c, 16d, with the underlying substrate material 15 acting as an etch stop layer. The etching process can also remove the hardmask material 22 and insulator material 24, while the masking material 20 protects the remaining underlying features, e.g., active gate structures 16. The masking material 20 can then be removed using a RIE process with a selective etch chemistry.

Figure 4:
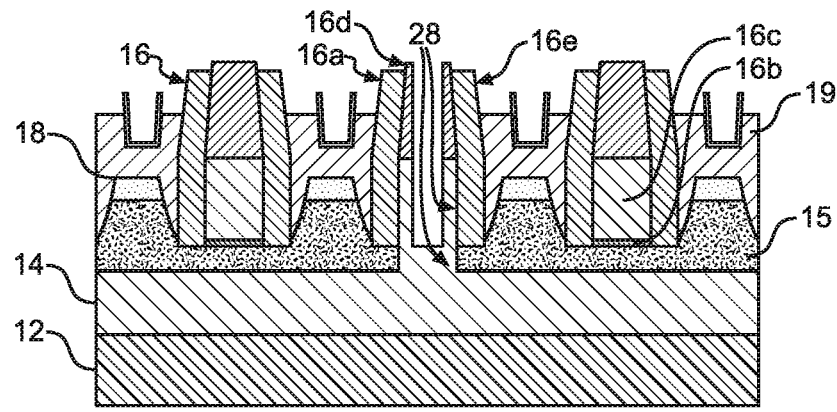
FIG. 4 shows an oxidized gate channel region, amongst other features, and respective fabrication processes in accordance with aspects of the present disclosure.

In FIG. 4, the materials 16b, 16c of the dummy gate structure 16a and the exposed semiconductor material 15 within the channel region of the dummy gate structure 16a will undergo an oxidation process to form an oxidized sidewall and channel region 28. The oxidized channel region 28, for example, will provide a physical isolation between the source and drain regions 18 of adjacent gate structures 16. This physical isolation, e.g., break of the substrate material 15, will advantageously reduce leakage of the devices (e.g., gate structures 16), while also increasing device performance, allowing different voltage controls for the source/drain regions and active gate structures and reducing the overall footprint of the structure.

In embodiments, the oxidation process is an SOI/C—SiGe channel oxidation process. In more specific embodiments, the oxidation process is a thermal oxidation process which produces a thin layer of oxide (usually silicon dioxide) on the surface of the sidewall spacers 16e and in the channel region of the dummy gate structure 16a. In this technique, an oxidizing agent is forced to diffuse into the materials 15, 16b, 16c at high temperature to react with the respective materials.

Figure 5:
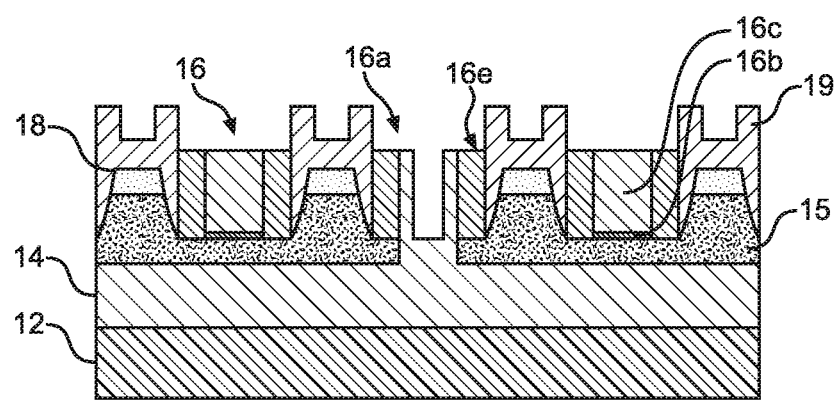
FIG. 5 shows portions of a dummy gate structure and insulator material removed, amongst other features, and respective fabrication processes in accordance with aspects of the present disclosure.

In FIG. 5, the remaining portions of the capping material 16d in the dummy gate structure 16a are removed by an etching process with a selective chemistry as should be understood by those of ordinary skill in the art. In addition, the capping material 16d on the active gate structures 16 will be removed during this etching process. The etching process will also recess the sidewall spacers 16e to a height of the poly material 16c of the active gates 16 and the oxidized sidewalls 28 of the dummy gate structure 16a.

Figure 6:
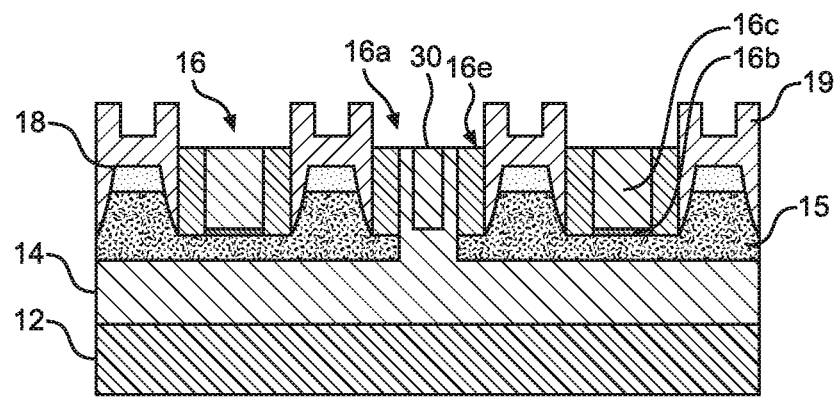
FIG. 6 shows an optical planarization layer (OPL) protecting the oxidized channel region of the dummy gate structure, amongst other features, and respective fabrication processes in accordance with aspects of the present disclosure.

As shown in FIG. 6, an optical planarization layer (OPL) 30 is deposited within the opening 26 and the over active gate structures 16. The OPL 30 is then recessed or etched back to within the opening 26, preferably slightly below the height of the oxidized sidewall spacers 28. The OPL 30 will remain in the opening 26 to protect the oxidized material, e.g., oxidized channel region of the dummy gate structure 16a.

Figure 7:
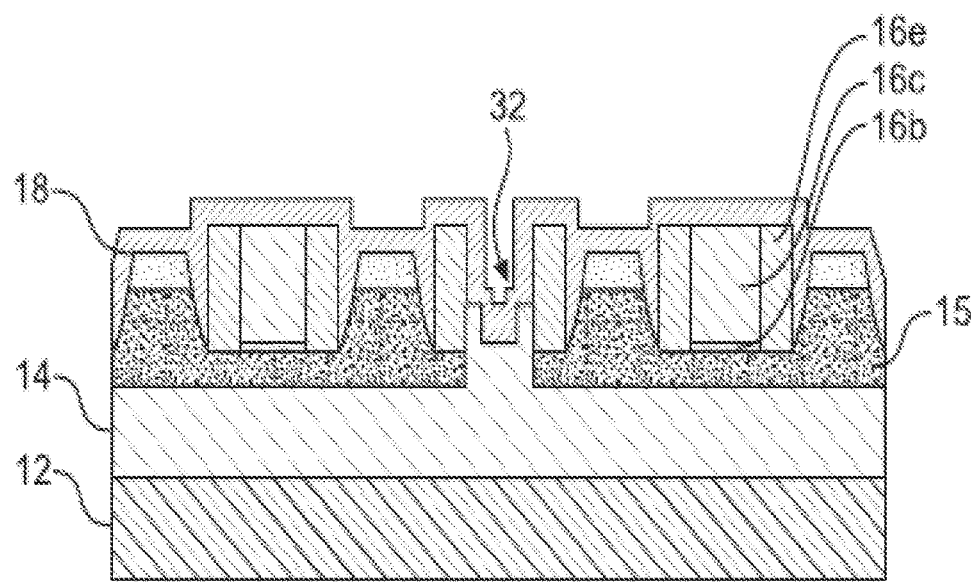
FIG. 7 shows masking material, e.g., nitride, blanket deposited over the structure including the oxidized channel region of the dummy gate structure, amongst other features, and respective fabrication processes in accordance with aspects of the present disclosure.

In FIG. 7, the insulator material 19 is removed by a selective etch process. During this etching process, the oxidized sidewalls and, importantly, the oxidized channel region 28 of the dummy gate structure 16a will be protected from erosion by the OPL 30. After the removal of the insulator material 19, the OPL 30 can be removed from the opening 26, leaving at least the oxidized channel region 28 (which includes a portion of the oxidized sidewalls also protected by the OPL 30).

A material 32, e.g., nitride, is then blanket deposited over the structure including, e.g., the oxidized channel region of the dummy gate structure 16a. The masking material 32 can be deposited by a conventional deposition process including a chemical vapor deposition (CVD) process. The material 32 can be deposited to about a thickness of 20 nm. In embodiments, the material 32 will merge with the sidewall spacers 16e.

Figure 8:
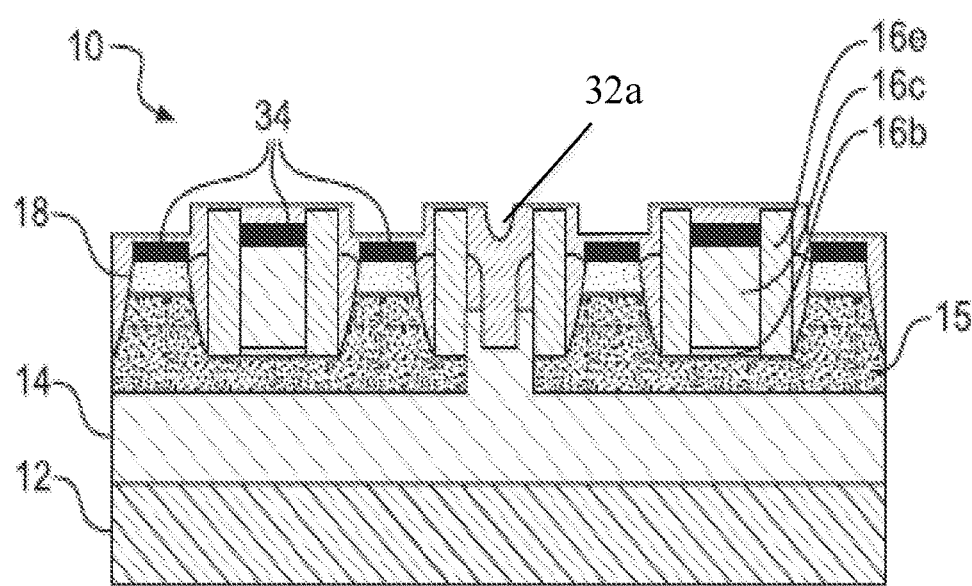
FIG. 8 shows silicided regions of active gate structures, amongst other features, and respective fabrication processes in accordance with aspects of the present disclosure.

As further shown in FIG. 8, the material 32 is removed over the active gate structures 16, while remaining in the opening 26 over the oxidized channel 28 of the dummy gate structure 16a and on sides of the source and drain regions 18 of the active gate structures 16. In embodiments, the material 32 between the sidewall spacers 16e of the dummy gate structure 16a will provide additional physical isolation between the active gate structures 16.

Still referring to FIG. 8, the gate structures 16, e.g., poly material 16c and the source/drain regions 18 will be silicided to form contact regions 34, followed by additional deposition of stress material 32a, e.g., nitride material. The additional deposition of the stress material 32a provides a dual liner (with the nitride (stress) material 32), which will impart a stress on the channel region of the active devices, e.g., gate structures 16. For example, the dual liner can impart a tensile stress on a NFET device and a compressive stress on a PFET device. The stress material 32a will also provide a physical isolation structure between the active devices.

As should be understood by those of skill in the art, the silicide process begins with deposition of a thin transition metal layer, e.g., nickel, cobalt or titanium, over fully formed and patterned semiconductor devices (e.g., doped or ion implanted source and drain regions 18 and poly material 16c of the respective devices 16). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts 34 in the active regions of the device 16. It should be understood by those of skill in the art that silicide contacts will not be required on the devices, when a gate structure is composed of a metal material.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
    a single diffusion break structure comprising an insulative fill material between and on sidewall spacers of the single diffusion break structure, the insulative fill material also extends outside of the sidewalls spacers over source and drain regions;
    the sidewall spacers comprising outer surfaces facing the source and drain regions and being located within a space between adjacent active gate structures;
    the adjacent active gate structures comprising gate electrodes;
    insulator material is provided over the gate electrodes; and
    a channel oxidation comprising oxidized semiconductor substrate material within a channel region below the insulative fill material, the channel oxidation further extending onto an inner portion of the sidewall spacers, wherein the insulative fill material is provided between the outer surfaces of the sidewall spacers and the source and drain regions.

2. The structure of claim 1, wherein the channel oxidation is the channel region of a dummy gate structure, which provides a physical isolation of the substrate material between active gate structures.

3. The structure of claim 1, wherein the channel oxidation is an oxidized Si channel material.

4. The structure of claim 1, wherein the channel oxidation is an oxidized SiGe channel material.

5. The structure of claim 1, wherein the single diffusion break structure includes an opening between the sidewall spacers of a dummy gate structure with the channel region below the opening.

6. The structure of claim 5, wherein the sidewall spacers are comprised of a nitride material.

7. The structure of claim 6, wherein the channel oxidation includes oxidized sidewalls extending partly on the sidewall spacers.

8. The structure of claim 7, wherein the insulative fill material comprises stress material filling the opening between the sidewall spacers of the dummy gate structure.

9. The structure of claim 8, wherein the stress material is nitride.

10. The structure of claim 1, wherein:
the channel oxidation includes upward extending portions which contact the inner portion of the sidewalls spacers;
the insulative fill material is an insulator material comprising a first material and a second material;
the first material is in a lower part of an opening formed by the sidewall spacers, and is in contact with the sidewall spacers which are of a same material as the first material;
the second material is over the first material within the opening;
the second material contacts the sidewalls spacers above the first material and the upward extending portions of the channel oxidation;
the source and drain regions are raised source and drain regions; and
the second material extends over the raised source and drain regions of adjacent active gate structures.

11. A structure comprising:
a plurality of active gate structures each comprising a channel region composed of semiconductor material, diffusion regions adjacent to the channel region and gate electrodes;
a diffusion break structure composed of sidewall spacers and an oxidation region of the semiconductor material both of which physically isolate the diffusion regions of adjacent active gate structures of the plurality of active gate structures; and
fill material between the sidewall spacers, and on inner and outer surfaces of the fill material between the sidewall spacers, on inner and outer surfaces of the sidewall spacers, and between the outer surfaces of the sidewall spacers and the diffusion regions,
insulative material on the gate electrodes of the adjacent active gate structures, wherein
the oxidation region includes upward extending regions which are provided on inner surfaces of the sidewall spacers, and
the fill material extends outside of the sidewalls spacers onto the diffusion regions adjacent to the channel region.

12. The structure of claim 11, wherein the fill material is within an opening of the diffusion break structure.

13. The structure of claim 12, wherein the fill material is a nitride stress material.

14. The structure of claim 13, wherein the oxidation region is a channel region of a dummy gate structure, and the oxidation region provides a physical isolation of semiconductor material between adjacent active gate structures of the plurality of active gate structures.

15. The structure of claim 14, wherein the channel region is an oxidized Si channel material.

16. The structure of claim 14, wherein the oxidation region is an oxidized SiGe channel material.

17. The structure of claim 14, wherein the oxidation region is fully depleted semiconductor on insulator technology.

18. The structure of claim 14, wherein the opening is between sidewall spacers above the oxidation region and the sidewall spacers are comprised of a nitride material.

19. The structure of claim 18, wherein the nitride stress material fills the opening between the sidewall spacers.

20. The structure of claim 11, wherein:
the channel region is of a dummy gate feature composed of the sidewall spacers;
the upward extending regions contact a lower, inner portion of the sidewall spacers;
the fill material is an insulator material comprising a first material and a second material;
the first material and the sidewall spacers are of a same material;
the first material is at a lower part of an opening between the sidewall spacers, and is in contact with the sidewall structures;
the second material is over the first material at an upper portion of the opening;
the second material contacts the sidewall spacers above the first material and the upward extending region of the oxidation region;
the diffusion regions are raised source and drain regions; and
the second material extends over the raised source and drain regions.

* * * * *

UNITED STATES PATENT AND TRADEMARK OFFICE
CERTIFICATE OF CORRECTION

PATENT NO. : 10,957,578 B2
APPLICATION NO. : 16/146413
DATED : March 23, 2021
INVENTOR(S) : Wei Hong et al.

It is certified that error appears in the above-identified patent and that said Letters Patent is hereby corrected as shown below:

In the Claims

In Claim 11, Line 1 and 2 at Column 8, delete "fill material between the sidewall spacers, and on inner and outer surfaces of the sidewall spacers".

Signed and Sealed this
Eighth Day of June, 2021

Drew Hirshfeld
*Performing the Functions and Duties of the*
*Under Secretary of Commerce for Intellectual Property and*
*Director of the United States Patent and Trademark Office*